United States Patent
Mathai et al.

(10) Patent No.: US 9,917,647 B2
(45) Date of Patent: Mar. 13, 2018

(54) COMBINATION UNDERFILL-DAM AND ELECTRICAL-INTERCONNECT STRUCTURE FOR AN OPTO-ELECTRONIC ENGINE

(75) Inventors: Sagi Varghese Mathai, Berkeley, CA (US); Michael Renne Ty Tan, Menlo Park, CA (US); Paul Kessler Rosenberg, Sunnyvale, CA (US); Wayne Victor Sorin, Mountain View, CA (US); Georgios Panotopoulos, Berkeley, CA (US); Susant K. Patra, Brentwood, CA (US); Joseph Straznicky, Santa Rosa, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 128 days.

(21) Appl. No.: 14/371,537

(22) PCT Filed: Jan. 31, 2012

(86) PCT No.: PCT/US2012/023251
§ 371 (c)(1),
(2), (4) Date: Jul. 10, 2014

(87) PCT Pub. No.: WO2013/115785
PCT Pub. Date: Aug. 8, 2013

(65) Prior Publication Data
US 2014/0328596 A1    Nov. 6, 2014

(51) Int. Cl.
*H01L 31/02*    (2006.01)
*H01L 31/0203*    (2014.01)
(Continued)

(52) U.S. Cl.
CPC ....... *H04B 10/2504* (2013.01); *G02B 6/4245* (2013.01); *H01L 31/0203* (2013.01);
(Continued)

(58) Field of Classification Search
CPC .................... H01L 31/0203; H01L 21/563
See application file for complete search history.

(56) References Cited

U.S. PATENT DOCUMENTS

| 5,247,597 A | 9/1993 | Blacha et al. |
| 5,940,564 A | 8/1999 | Jewell |

(Continued)

FOREIGN PATENT DOCUMENTS

| CN | 1541342 A | 10/2004 |
| CN | 1599159 A | 3/2005 |

(Continued)

OTHER PUBLICATIONS

Extended European Search Report received in EP Application No. 12867223.5, Aug. 21, 2015, 9 pages.

(Continued)

*Primary Examiner* — Jesse Y Miyoshi
*Assistant Examiner* — David Spalla
(74) *Attorney, Agent, or Firm* — Wagner Blecher, LLP

(57) ABSTRACT

A combination underfill-dam and electrical-interconnect structure for an opto-electronic engine. The structure includes a first plurality of electrical-interconnect solder bodies. The first plurality of electrical-interconnect solder bodies includes a plurality of electrical interconnects. The first plurality of electrical-interconnect solder bodies, is disposed to inhibit intrusion of underfill material into an optical pathway of an opto-electronic component for the opto-electronic engine. A system and an opto-electronic engine that include the combination underfill-dam and electrical interconnect structure are also provided.

19 Claims, 8 Drawing Sheets

(51) Int. Cl.
*H01L 31/167* (2006.01)
*H04B 10/25* (2013.01)
*G02B 6/42* (2006.01)
*H05K 1/02* (2006.01)

(52) U.S. Cl.
CPC ...... *H01L 31/02005* (2013.01); *H01L 31/167* (2013.01); *H05K 1/0274* (2013.01); *H05K 2201/0305* (2013.01); *H05K 2201/10121* (2013.01); *H05K 2201/10977* (2013.01)

(56) References Cited

U.S. PATENT DOCUMENTS

| | | | |
|---|---|---|---|
| 6,243,508 B1 | 6/2001 | Jewell et al. | |
| 6,512,861 B2 | 1/2003 | Chakravorty et al. | |
| 6,527,456 B1 | 3/2003 | Trezza | |
| 6,605,828 B1* | 8/2003 | Schwarzrock | G01D 5/34715 257/678 |
| 6,626,585 B1 | 9/2003 | Malone | |
| 6,800,946 B2 | 10/2004 | Chason et al. | |
| 6,907,151 B2 | 6/2005 | Yunus | |
| 6,931,181 B2 | 8/2005 | Jewell et al. | |
| 6,933,173 B2 | 8/2005 | Yunus | |
| 6,940,182 B2 | 9/2005 | Hilton et al. | |
| 7,251,398 B2 | 7/2007 | Baets et al. | |
| 7,263,248 B2 | 8/2007 | Windover | |
| 7,389,026 B2 | 6/2008 | Nagasaka | |
| 7,466,880 B2 | 12/2008 | Windover | |
| 7,720,337 B2 | 5/2010 | Lu et al. | |
| 7,821,131 B2* | 10/2010 | Johnson | H01L 21/563 257/737 |
| 7,853,105 B2 | 12/2010 | Budd et al. | |
| 7,961,770 B1 | 6/2011 | Zhu et al. | |
| 8,265,432 B2 | 9/2012 | Doany et al. | |
| 8,536,512 B2 | 9/2013 | Shiraishi | |
| 8,708,576 B2 | 4/2014 | Shacklette et al. | |
| 2001/0036344 A1 | 11/2001 | Steinberg et al. | |
| 2002/0047216 A1 | 4/2002 | Jiang et al. | |
| 2002/0159673 A1 | 10/2002 | McFarland et al. | |
| 2004/0057648 A1 | 3/2004 | Yunus | |
| 2004/0076382 A1 | 4/2004 | Saia et al. | |
| 2004/0118599 A1* | 6/2004 | Chason | B81C 1/00333 174/260 |
| 2004/0126050 A1 | 7/2004 | Claydon et al. | |
| 2004/0156576 A1 | 8/2004 | Windover | |
| 2005/0224967 A1* | 10/2005 | Brandenburg | H01L 23/293 257/737 |
| 2006/0239631 A1 | 10/2006 | Frenzel | |
| 2008/0291552 A1 | 11/2008 | Nogami | |
| 2009/0162005 A1 | 6/2009 | Lu et al. | |
| 2010/0061418 A1 | 3/2010 | Lambkin et al. | |
| 2010/0322551 A1 | 12/2010 | Budd et al. | |
| 2011/0012249 A1 | 1/2011 | Daubenspeck et al. | |
| 2011/0044367 A1 | 2/2011 | Budd et al. | |
| 2011/0095421 A1 | 4/2011 | Kim et al. | |
| 2011/0260338 A1* | 10/2011 | Lee | H01L 21/563 257/778 |
| 2012/0267731 A1* | 10/2012 | Graf | G01L 19/148 257/415 |
| 2013/0266255 A1 | 10/2013 | Tan et al. | |

FOREIGN PATENT DOCUMENTS

| | | |
|---|---|---|
| CN | 1723405 A | 1/2006 |
| CN | 1732399 A | 2/2006 |
| JP | 2010042633 A | 2/2010 |
| JP | 2011082305 A | 4/2011 |
| KR | 10-0691443 B1 | 2/2007 |
| WO | WO-2004049521 A2 | 6/2004 |
| WO | WO-2011060559 A1 | 5/2011 |
| WO | WO-2012096651 A1 | 7/2012 |
| WO | WO-2013036221 A1 | 3/2013 |
| WO | WO-2013115785 A1 | 8/2013 |

OTHER PUBLICATIONS

Doany, F. E., et al., Dense 24 TX+24 RX Fiber-Coupled Optical Module Based on a Holey CMOS Transceiver IC, Electronic Components and Technology Conference, IEEE, 2010; pp. 247-255. (201005109).

Holm, J. et al., Through-Etched Silicon Carriers for Passive Alignment of Optical Fibers to Surface-Active Optoelectronic Components, May 8, 2000. (201005109).

International Search Report and Written Opinion, Oct. 23, 2012, PCT Patent Application No. PCT/US2012/023251, 9 pages.

International Search Report, Sep. 30, 2011, PCT Patent Application No. PCT/US2011/020785, 4 pages.

International Search Report, Apr. 9, 2012, PCT Patent Application No. PCT/US2011/050551, 3 pages.

Li, B. et al., Low-Cost High-Efficiency Optical Coupling Using Through-Silicon-Hole in Parallel Optical Transceiver Module, Applied Physics A, Feb. 19, 2009, pp. 1123-1126; vol. 95, <http://www.springerlink.com/content/97328k55664702k5/fulltext.pdf>. (201005109).

Yan, J. et al., Passive Fibre Alignment on Optoelectronic Components for Electro-Optical Links Based on Single-Chip Technology and VCSELs, Jan. 2010, <http://en.cnki.com.cn/Article_en/CJFDTOTAL-YZDL201001014.htm>. (201005109).

Supplemental European Search Report, dated Jan. 26, 2015, European Patent Application No. 11872062.2, 3 pages.

\* cited by examiner

COMBINATION UNDERFILL-DAM AND ELECTRICAL-INTERCONNECT STRUCTURE FOR AN OPTO-ELECTRONIC ENGINE

RELATED APPLICATIONS

This application is related to PCT Patent Application, Ser. No. PCT/US12/23251 by Michael Renne Ty Tan, et al., filed on Jan. 11, 2011, entitled "PASSIVE OPTICAL ALIGNMENT," and assigned to the assignee of the present technology.

TECHNICAL FIELD

Examples of the present technology relate generally to interfaces for opto-electronic engines, opto-electronic engines, and systems including opto-electronic engines.

BACKGROUND

As the band-width in data processing and communications grows, engineers and scientists engaged in data systems design have turned with increasing interest to fiber optics as a means for providing data processing and communications with high band-width. Thus, vertical-cavity, surface-emitting lasers (VCSELs) and photo-diodes (PDs) coupled to optical fibers in arrays of optical transmitters and optical receivers, respectively, are finding increasing application as means for providing high band-width data processing and communication. Thus, as engineers and scientists have become more engaged in research and development of systems utilizing such optical fibers, VCSELs and PDs, their attention has increasingly turned towards designing such systems with high reliability and low cost, to meet the increasing challenges presented by data processing and communications at high band-widths.

DESCRIPTION OF THE DRAWINGS

The accompanying drawings, which are incorporated in and form a part of this specification, illustrate examples of the technology and, together with the description, serve to explain the examples of the technology.

Figure 1:
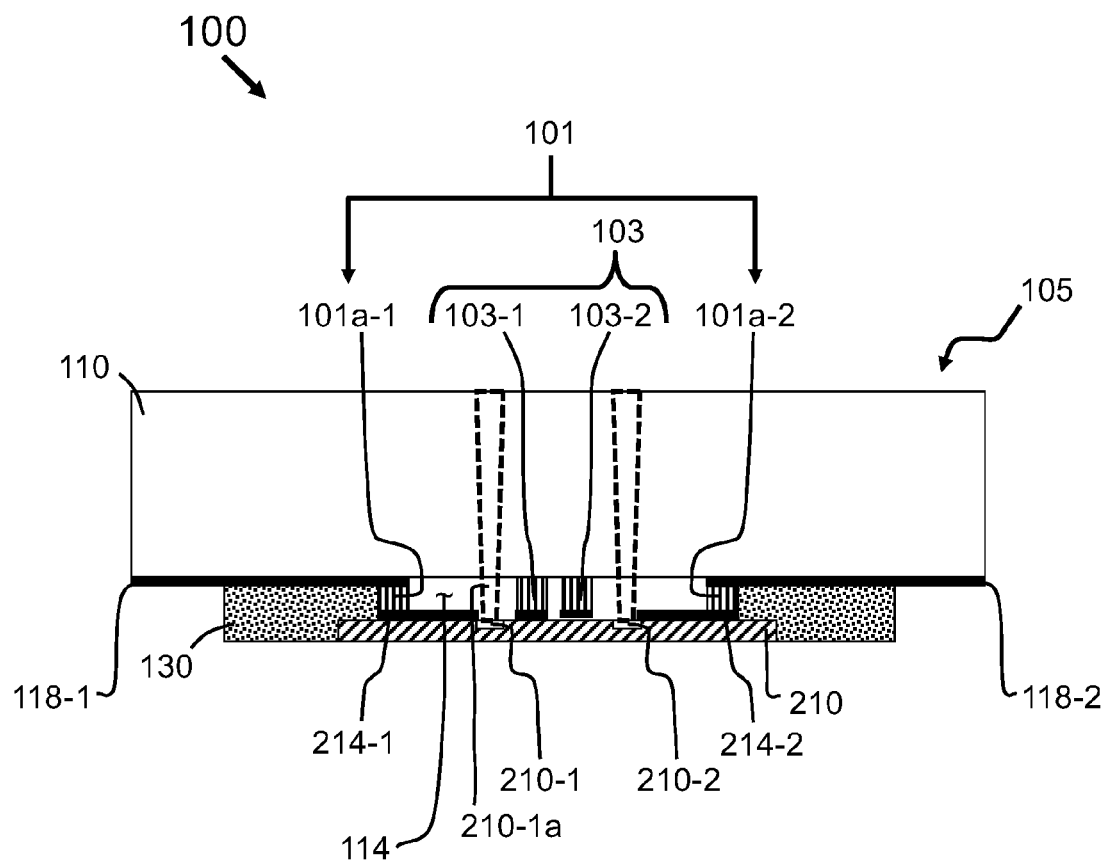
FIG. 1 is a cross-sectional view of an opto-electronic engine including a combination underfill-dam and electrical-interconnect structure, in accordance with examples of the present technology.

The drawings referred to in this description should not be understood as being drawn to scale except if specifically noted.

DESCRIPTION OF EXAMPLES

Reference will now be made in detail to the alternative examples of the present technology. While the technology will be described in conjunction with the alternative examples, it will be understood that they are not intended to limit the technology to these examples. On the contrary, the technology is intended to cover alternatives, modifications and equivalents, which may be included within the spirit and scope of the technology as defined by the appended claims.

Furthermore, in the following description of examples of the present technology, numerous specific details are set forth in order to provide a thorough understanding of the present technology. However, it should be noted that examples of the present technology may be practiced without these specific details. In other instances, well known methods, procedures, and components have not been described in detail as not to unnecessarily obscure examples of the present technology. Throughout the drawings, like components are denoted by like reference numerals, and repetitive descriptions are omitted for clarity of explanation if not necessary. As used herein, the articles, "a" and "an," will be understood as including the plural referents. Also, as used herein, the article, "the," and "the" will be understood as including the plural referents. In addition, as used herein, the term of art, "at least one," will be understood as including the plural referents.

Examples of the present technology include a combination underfill-dam and electrical-interconnect structure for an opto-electronic engine. The structure includes a first plurality of electrical-interconnect solder bodies. The first plurality of electrical-interconnect solder bodies includes a plurality of electrical interconnects. The first plurality of electrical-interconnect solder bodies is disposed to inhibit intrusion of underfill material into an optical pathway of an opto-electronic component for the opto-electronic engine. Examples of the present technology also include the opto-electronic engine that includes a die, a carrier, an underfill layer containing the underfill material, the opto-electronic component, and the combination underfill-dam and electrical-interconnect structure of the opto-electronic engine. Thus, subsequently described examples of the present technology for the combination underfill-dam and electrical-interconnect structure may also be understood as being incorporated within the opto-electronic engine.

Moreover, examples of the present technology also include an opto-electronic engine including the combination underfill-dam and electrical-interconnect structure that includes a plurality of opto-electronic components configured as optical output transmitters for bit-lines of an optical bus, or alternatively, optical input receivers on bit-lines of the optical bus. Other examples of the present technology include a system including at least one optical bus and at least one opto-electronic engine including the combination underfill-dam and electrical-interconnect structure. Further examples of the present technology include a system including a digital-information processor that includes at least one optical bus and at least one opto-electronic engine including the combination underfill-dam and electrical-interconnect structure to transfer information between one component and another component coupled to the optical bus in the digital-information processor. Similarly, yet other examples of the present technology include a system including a data-processing center that includes at least one optical bus and at least one opto-electronic engine including the combination underfill-dam and electrical-interconnect structure to transfer information between one digital-information processor and at least one other digital-information processor coupled to the optical bus in the data-processing center. Thus, subsequently described examples of the present technology for the opto-electronic engine, which includes the combination underfill-dam and electrical-interconnect structure, and for the combination underfill-dam and electrical-interconnect structure, itself, may also be understood as being incorporated within the following environments: the system including at least one optical bus and at least one opto-electronic engine, the digital-information processor, and the data-processing center.

Examples of the present technology prevent underfill materials from covering the optical aperture of opto-electronic components of the opto-electronic engine, by way of example, lasers, photodetectors and light-emitting diodes, without limitation thereto. Intrusion of such underfill material into the optical path over the optical aperture may cause losses in the transmission of optical information being transmitted to, or from, an opto-electronic component of the opto-electronic engine. Thus, examples of the present technology obviate such transmission losses, and thus, reduce cost, and increase reliability of opto-electronic engines. Moreover, as the optical path associated with the optical aperture is free from underfill material, design considerations related to the selection of the underfill material may be loosened, such that transparency and the index of refraction of the underfill material may no longer be of concern to the designer of the opto-electronic engine. Thus, the scope of design of the opto-electronic engine is expanded. This expanded scope of design allows the designer greater freedom to select an underfill material from a broader class of underfill materials, which may also further reduce cost and increase reliability of the opto-electronic engine.

Figure 2:
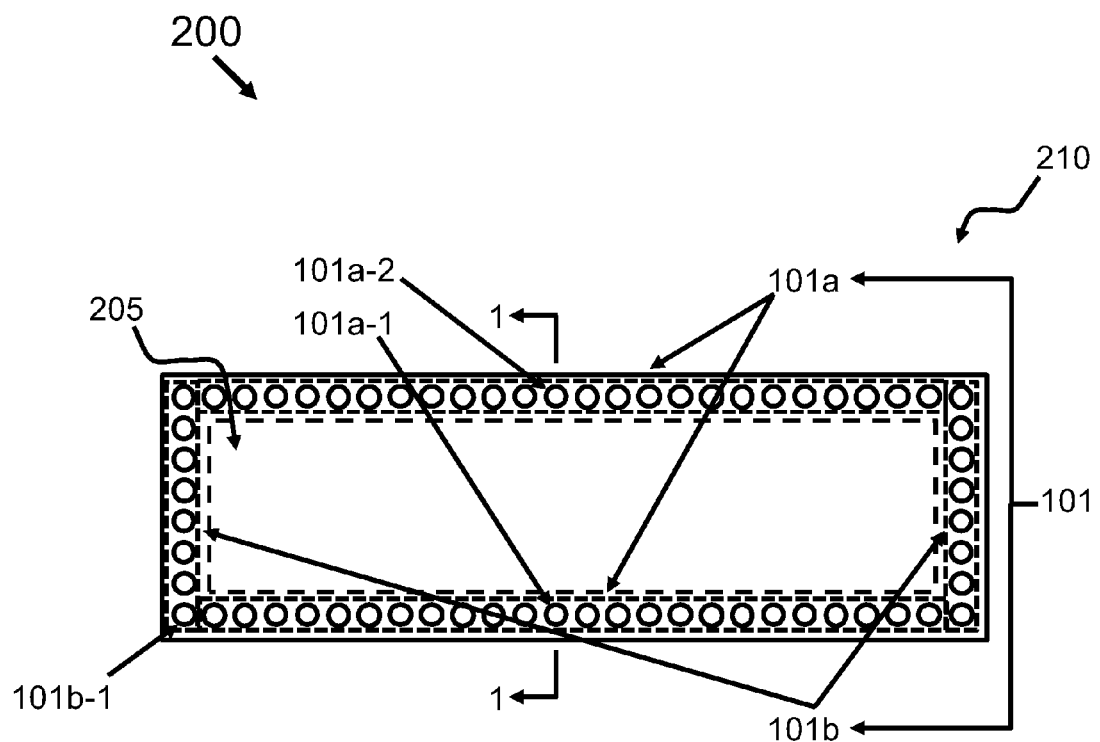
FIG. 2 is a plan view of the combination underfill-dam and electrical-interconnect structure of the opto-electronic engine of FIG. 1, disposed on a die for an opto-electronic component of the opto-electronic engine, detailing the arrangement in the combination underfill-dam and electrical-interconnect structure of a first plurality of electrical-interconnect solder bodies, and a second plurality of spacer solder bodies, in accordance with examples of the present technology.

With reference now to FIGS. 1 and 2, in accordance with examples of the present technology, a cross-sectional view 100 is shown in FIG. 1 of an opto-electronic engine 105 including a combination underfill-dam and electrical-interconnect structure 101; and, a plan view 200 is shown in FIG. 2 of the combination underfill-dam and electrical-interconnect structure 101 of the opto-electronic engine 105 of FIG. 1. The opto-electronic engine 105 includes a die 210, a carrier 110, an underfill layer 130 containing underfill material, an opto-electronic component 210-1, and the combination underfill-dam and electrical-interconnect structure 101. The die 210 includes at least one opto-electronic component 210-1. The combination underfill-dam and electrical-interconnect structure 101, includes a first plurality 101a of electrical-interconnect solder bodies, of which electrical-interconnect solder bodies 101a-1 and 101a-2 are examples, and a second plurality 101b of spacer solder bodies, of which spacer solder body 101b-1 is an example. The opto-electronic engine 105 may also include a third plurality 103 of mechanical-support solder bodies, of which mechanical-support solder bodies 103-1 and 103-2 are examples, that provide mechanical supports between the die 210 and the carrier 110. Within the spirit and scope of examples of the present technology, the first plurality 101a of electrical-interconnect solder bodies, the second plurality 101b of spacer solder bodies, and the third plurality 103 of mechanical-support solder bodies may be composed of a variety of solder materials, and have a variety of shapes.

The first plurality 101a of electrical-interconnect solder bodies, of which electrical-interconnect solder bodies 101a-1 and 101a-2 are examples, and the second plurality 101b of spacer solder bodies, of which spacer solder body 101b-1 is an example, include solder joints and an underfill dam. The solder joints join the die 210 and the carrier 110. For example, electrical traces 118-1 and 118-2 disposed on the carrier 110 are joined by electrical-interconnect solder bodies 101a-1 and 101a-2 to electrical traces 214-1 and 214-2 disposed on the die 210, which provide electrical continuity to the opto-electronic components 210-1 and 210-2, respectively. Thus, in accordance with examples of the present technology, the first plurality 101a of electrical-interconnect solder bodies, of which electrical-interconnect solder bodies 101a-1 and 101a-2 are examples, includes a plurality of electrical interconnects.

In addition, the underfill dam bars intrusion of underfill material from the underfill layer 130 into the optical pathway 210-1a. The underfill layer 130 is disposed outside of an optical pathway 210-1a of the opto-electronic component 210-1. The optical pathway 210-1a is disposed within a cavity 114 defined between the die 210 and the carrier 110. The cavity 114 is free of underfill material from the underfill layer 130 that might interfere with the transmission of light to, or from, the opto-electronic component 210-1. Moreover, light may be transmitted through the carrier 110, which itself may be transparent in the frequency band in which the light lies, or alternatively, may be provided with through optical vias (TOVs) and apertures for the transmission of light. By way of example, the carrier may be selected from the group consisting of a silicon substrate, a glass substrate, a plastic substrate, a printed circuit board (PCB), and a flexible printed circuit (FPC), without limitation thereto. By way of further example, the opto-electronic component 210-1 may be selected from the group consisting of a vertical-cavity, surface-emitting laser (VCSEL), and a photo-diode, without limitation thereto.

With reference now to FIG. 2 and further reference to FIG. 1, in accordance with examples of the present technology, the plan view 200 of the combination underfill-dam and electrical-interconnect structure 101 of the opto-electronic engine 105 of FIG. 1 is shown at an initial stage in fabrication of the opto-electronic engine 105. For reference, the line 1-1 is the trace of the plane of the cross-sectional view 100 shown in FIG. 1. FIG. 2 shows details of the arrangement in the combination underfill-dam and electrical-interconnect structure 101 including a first plurality 101*a* of electrical-interconnect solder bodies, of which electrical-interconnect solder bodies 101*a*-1 and 101*a*-2 are examples, and a second plurality 101*b* of spacer solder bodies, of which spacer solder body 101*b*-1 is an example. By way of example, as shown in FIG. 2, the combination underfill-dam and electrical-interconnect structure 101 may be disposed on the die 210 for the opto-electronic component 210-1 of the opto-electronic engine 105, without limitation thereto. Alternatively, the combination underfill-dam and electrical-interconnect structure 101 may be disposed on the carrier 110, which is later coupled with the die 210 including the opto-electronic component 210-1, in subsequent operations in the fabrication of the opto-electronic engine 105. Thus, the first plurality 101*a* of electrical-interconnect solder bodies, of which electrical-interconnect solder bodies 101*a*-1 and 101*a*-2 are examples, may be disposed on the die 210 including the opto-electronic component 210-1, or alternatively, on the carrier 110.

Similarly, the second plurality 101*b* of spacer solder bodies, of which spacer solder body 101*b*-1 is an example, may be disposed on the die 210 including the opto-electronic component 210-1, or alternatively, on the carrier 110. Moreover, in accordance with other examples of the present technology, the first plurality 101*a* of electrical-interconnect solder bodies may be disposed on the die, while the second plurality 101*b* of spacer solder bodies may be disposed on the carrier, or vice versa. Other combinations for the disposition of solder bodies of the first plurality 101*a* of electrical-interconnect solder bodies and the second plurality 101*b* of spacer solder bodies, such that some of the electrical-interconnect solder bodies of the first plurality 101*a* of electrical-interconnect solder bodies, and some of the spacer solder bodies of the second plurality 101*b* of electrical-interconnect solder bodies are disposed on both the die 210 and the carrier 110 are also within the spirit and scope of examples of the present technology. In other examples of the present technology, the first plurality 101*a*, second plurality 101*b*, and third plurality 103 of solder bodies may be disposed on the carrier surface, on a raised surface formed on the carrier 110, or a recessed surface formed on the carrier 110. Alternatively, the first plurality 101*a*, second plurality 101*b*, and third plurality 103 of solder bodies may be disposed on the die surface, on a raised surface formed on the die 210, or a recessed surface formed on the die 210. The first plurality 101*a*, second plurality 101*b*, and third plurality 103 of solder bodies may also be disposed on the die 210 and carrier 110. For example, the carrier 110 may be etched to form mesas on which solder bodies are formed, in which case, the solder bodies are raised above the carrier surface and the combination mesa and solder body forms the underfill dam. Thus, in accordance with examples of the present technology, the underfill dam may include solder bodies of the first plurality 101*a*, second plurality 101*b*, and third plurality 103 of solder bodies and the surface feature, for example, a mesa, or trench, to which the solder bodies are attached.

With further reference to FIGS. 1 and 2, in accordance with examples of the present technology, the first plurality 101*a* of electrical-interconnect solder bodies, of which electrical-interconnect solder bodies 101*a*-1 and 101*a*-2 are examples, includes a plurality of electrical interconnects. At the same time, the first plurality 101*a* of electrical-interconnect solder bodies, of which electrical-interconnect solder bodies 101*a*-1 and 101*a*-2 are examples, is disposed to inhibit intrusion of underfill material into the optical pathway 210-1*a* of the opto-electronic component 210-1 for the opto-electronic engine 105. A spatial arrangement, for example, the spacing between adjacent electrical-interconnect solder bodies, may produce an interaction with the underfill material of the underfill layer 130 such that surface tension inhibits passage of the underfill material between adjacent solder bodies of the first plurality 101*a* of electrical-interconnect solder bodies. Thus, in accordance with examples of the present technology, the spatial arrangement of the first plurality 101*a* of electrical-interconnect solder bodies is arranged to inhibit intrusion of underfill material into an optical pathway 210-1*a* of an opto-electronic component 210-1 for the opto-electronic engine 105.

Moreover, in a case in which the first plurality 101*a* of electrical-interconnect solder bodies alone surround the cavity 114 including the optical pathway 210-1*a*, the spatial arrangement of the first plurality 101*a* of electrical-interconnect solder bodies may be arranged to bar intrusion of underfill material into an optical pathway 210-1*a* of an opto-electronic component 210-1 for the opto-electronic engine 105, even in the absence of the second plurality 101*b* of spacer solder bodies (not shown). In addition, the first plurality 101*a* of electrical-interconnect solder bodies, of which electrical-interconnect solder bodies 101*a*-1 and 101*a*-2 are examples, that includes the plurality of electrical interconnects is to provide electrical continuity for electrical signals passed between a die 210 including the opto-electronic component 210-1 disposed on the carrier 110. Thus, in accordance with examples of the present technology, an electrical-interconnect solder body, of which electrical-interconnect solder bodies 101*a*-1 and/or 101*a*-2 are examples, of the first plurality 101*a* of electrical-interconnect solder bodies includes a combination of an element of an underfill dam and an electrical interconnect of the plurality of electrical interconnects.

With further reference to FIGS. 1 and 2, in accordance with examples of the present technology, the combination underfill-dam and electrical-interconnect structure 101 may also include a second plurality 101*b* of spacer solder bodies, of which spacer solder body 101*b*-1 is an example. The second plurality 101*b* of spacer solder bodies may be arranged to mechanically support the die 210. Moreover, the electrical-interconnect solder bodies, of which electrical-interconnect solder bodies 101*a*-1 and 101*a*-2 are examples, in the first plurality 101*a* of electrical-interconnect solder bodies, and spacer solder bodies, of which spacer solder body 101*b*-1 is an example, in the second plurality 101*b* of spacer solder bodies may together be arranged to mechanically support the die 210.

The first plurality 101*a* of electrical-interconnect solder bodies, of which electrical-interconnect solder bodies 101*a*-1 and 101*a*-2 are examples, and the second plurality 101*b* of spacer solder bodies, of which spacer solder body 101*b*-1 is an example, enclose the optical pathway 210-1*a* of the opto-electronic component 210-1 for the opto-electronic engine 105, and in combination include an underfill dam to bar intrusion of underfill material from the underfill layer 130 into the optical pathway 210-1*a*. A spatial arrangement of the electrical-interconnect solder bodies in the first plurality 101*a* of electrical-interconnect solder bodies and spacer solder bodies in the second plurality 101*b* of spacer solder bodies, for example, the spacing between adjacent solder bodies, produce an interaction with underfill material of the underfill layer 130 such that surface tension bars passage of the underfill material between adjacent solder bodies of the combined plurality of both the first plurality 101*a* of electrical-interconnect solder bodies and the second plurality 101*b* of spacer solder bodies 101*b*-1. Thus, in accordance with examples of the present technology, the spatial arrangement of the electrical-interconnect solder bodies in the first plurality 101*a* of electrical-interconnect solder bodies and of the spacer solder bodies in the second plurality 101*b* of spacer solder bodies is to bar intrusion of underfill material from the underfill layer 130 into an optical pathway 210-1*a* of an opto-electronic component 210-1 for the opto-electronic engine 105.

With further reference to FIGS. 1 and 2, in accordance with examples of the present technology, an electrical-interconnect solder body, of which electrical-interconnect solder bodies 101*a*-1 and 101*a*-2 are examples, of the first plurality 101*a* of electrical-interconnect solder bodies may include a solder ball. Alternatively, the electrical-interconnect solder body, of which electrical-interconnect solder bodies 101*a*-1 and 101*a*-2 are examples, of the first plurality 101*a* of electrical-interconnect solder bodies may include a solder preform, a thin film of solder, or other form of solder body. Similarly, a spacer solder body, of which spacer solder body 101*b*-1 is an example, of the second plurality 101*b* of spacer solder bodies may include a solder ball. Alternatively, the spacer solder body, of which spacer solder body 101*b*-1 is an example, of the second plurality 101*b* of spacer solder bodies may also include a solder preform, a thin film of solder, or other form of solder body.

In accordance with examples of the present technology, the spacing, also referred to by the term of art "pitch," between adjacent solder bodies of the first plurality 101*a* of electrical-interconnect solder bodies and the second plurality 101*b* of spacer solder bodies, as well as the size, shape, and material of the solder bodies of the first plurality 101*a* of electrical-interconnect solder bodies and the second plurality 101*b* of spacer solder bodies may be adjusted depending on the viscosity and other rheological properties of the underfill material to preclude more effectively underfill material from entering the cavity 114 and occluding optical pathways of the opto-electronic components of the die 210, of which optical pathway 210-1*a* of opto-electronic component 210-1 is an example. Moreover, although the solder bodies have been described, in one example of the present technology, as solder balls, examples of the present technology also include within their spirit and scope other shapes of the solder bodies, for example, rectangular bumps. Also, the shape and material of the solder body may be selected based on the viscosity and other rheological properties of the underfill material also to preclude more effectively underfill material from entering the cavity 114 and occluding optical pathways of the opto-electronic components of the die 210.

With further reference to FIGS. 1 and 2, in accordance with examples of the present technology, an interior surface 205 of the die 210 may be disposed within the cavity 114. The interior surface 205 includes an area within which opto-electronic components, of which opto-electronic component 210-1 is an example, may be fabricated in the die 210. As shown in FIG. 2, the combined plurality of both the first plurality 101*a* of electrical-interconnect solder bodies and the second plurality 101*b* of spacer solder bodies 101*b*-1 are disposed along the periphery of the die 210 and surround the interior surface 205. Alternatively, in accordance with examples of the present technology, the interior surface 205 may be surrounded just by the first plurality 101*a* of electrical-interconnect solder bodies, of which electrical-interconnect solder bodies 101*a*-1 and 101*a*-2 are examples.

In one example of the present technology, the interior surface 205 may be provided with a surface treatment that prevents wetting of the interior surface 205 by the underfill material of the underfill layer 130. The surface treatment may be selected from the group consisting of a thin coating that repels the underfill material, for example, a thin coating that is dewetted by the underfill material, and a texturing of the interior surface 205 that raises a surface energy between the interior surface 205 and the underfill material. In one example of the present technology, the surface texturing may include a plurality of pillars that reduce the surface area that can be wetted by the underfill material. In another example of the present technology, the surface treatment may include treating the interior surface 205 with a plasma having chemical constituents that produce a surface layer of the interior surface that would cause the underfill material to dewet the interior surface 205.

In one example of the present technology, the first plurality 101*a* of electrical-interconnect solder bodies and the second plurality 101*b* of solder bodies have a solder-body surface treatment which causes the underfill material to wet the first plurality 101*a* of electrical-interconnect solder bodies and the second plurality 101*b* of solder bodies and inhibits the underfill material from flowing past the first plurality 101*a* of electrical-interconnect solder bodies and the second plurality 101*b* of spacer solder bodies. By way of example, the solder-body surface treatment may include a surface treatment selected from the group consisting of a thin coating that is wetted by the underfill material, and a texturing of a surface of a solder body from the group of the first plurality 101*a* of electrical-interconnect solder bodies and the second plurality 101*b* of spacer solder bodies, such that the texturing lowers a surface energy between the surface of the solder body and the underfill material, without limitation thereto.

Figure 3:
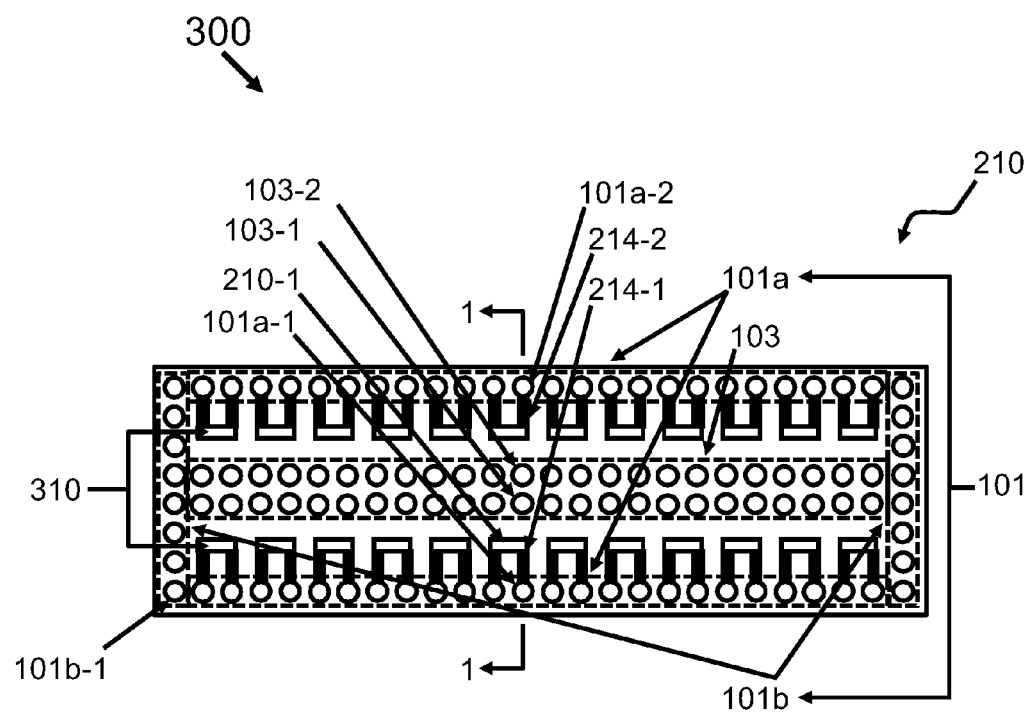
FIG. 3 is a plan view of the combination underfill-dam and electrical-interconnect structure and die of FIG. 2, including a plurality of opto-electronic components, and a third plurality of mechanical-support solder bodies, in accordance with examples of the present technology.

With reference now to FIG. 3 and further reference to FIGS. 1-2, in accordance with examples of the present technology, a plan view 300 of the combination underfill-dam and electrical-interconnect structure 101 and die 210 of FIG. 2 is shown at an intermediate stage in fabrication of the opto-electronic engine 105. For reference, the line 1-1 is the trace of the plane of the cross-sectional view 100 shown in FIG. 1. As shown in FIG. 3, the die includes a plurality 310 of opto-electronic components that are arranged in two 1×12 arrays at the top side and bottom side of the drawing of the die 210. In one example of the present technology, one of the 1×12 arrays may include optical transmitting opto-electronic components, such as VCSELs, or LEDs. In another example of the present technology, the other 1×12 array may include optical receiving opto-electronic components, such as photodiodes. One transmitting opto-electronic component and one receiving opto-electronic component may be interfaced to a single optical fiber in an optical-fiber array (not shown), as an optical transceiver. As shown in FIG. 3, the die may also include two 1×24 arrays of electrical traces, of which electrical traces 214-1 and 214-2 are examples, for providing electrical signals to, or from, the opto-electronic components, of which opto-electronic components 210-1 and 210-2 are examples. As shown in FIG. 3, the die also includes a third plurality 103 of mechanical-support solder bodies, of which mechanical-support solder bodies 103-1 and 103-2 are examples. Thus, in accordance with examples of the present technology, the opto-electronic engine 105 may further include the third plurality 103 of mechanical-support solder bodies, of which mechanical-support solder bodies 103-1 and 103-2 are examples, which provide additional mechanical supports between the die 210 and the carrier 110.

Figure 4:
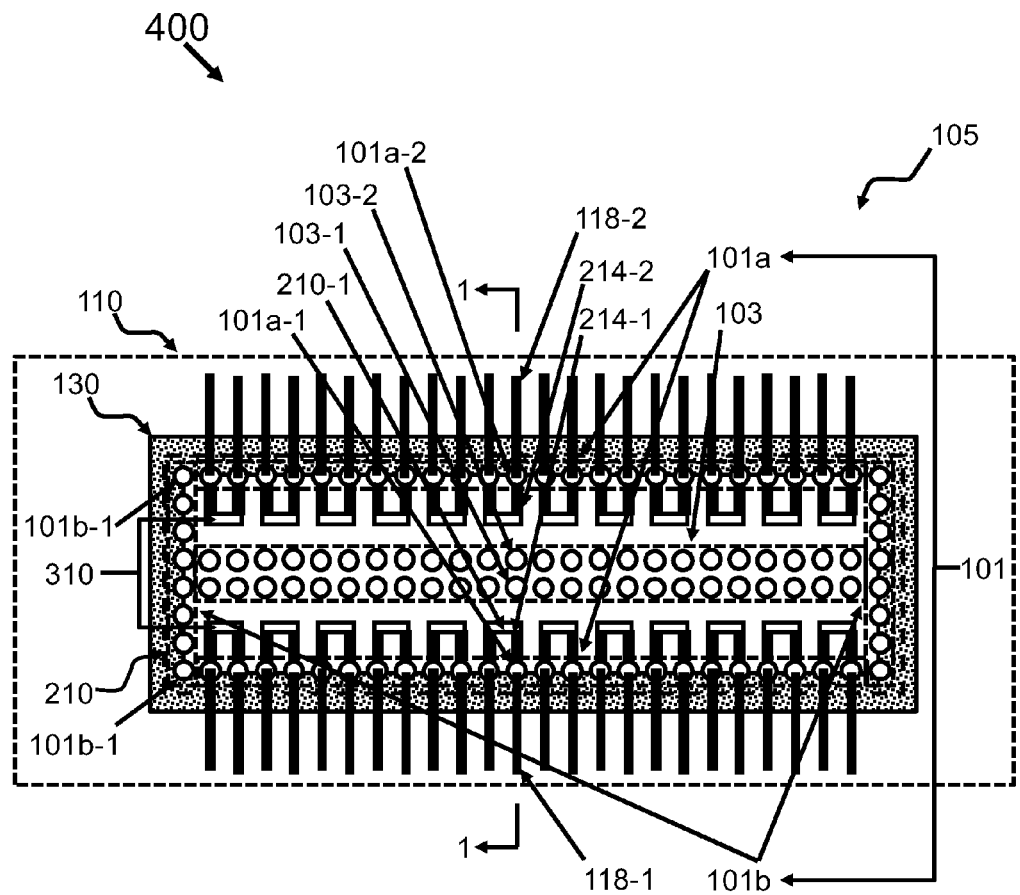
FIG. 4 is a plan view of the opto-electronic engine of FIG. 1, detailing the arrangement of the first plurality of electrical-interconnect solder bodies, the second plurality of spacer solder bodies and the third plurality of mechanical-support solder bodies, with respect to the die, a carrier and underfill layer of the opto-electronic engine, in accordance with examples of the present technology.

With reference now to FIG. 4 and further reference to FIGS. 2-3, in accordance with examples of the present technology, a plan view 400 of the opto-electronic engine 105 of FIG. 1 is shown upon completion of fabrication of the opto-electronic engine 105. For reference, the line 1-1 is the trace of the plane of the cross-sectional view 100 shown in FIG. 1. FIG. 4 shows details of the arrangement of the first plurality 101a of electrical-interconnect solder bodies, of which electrical-interconnect solder bodies 101a-1 and 101a-2 are examples, the second plurality 101b of spacer solder bodies, of which spacer solder body 101b-1 is an example, and the third plurality 103 of mechanical-support solder bodies, of which mechanical-support solder bodies 103-1 and 103-2 are examples, with respect to the die 210, the carrier 110 and the underfill layer 130 of the opto-electronic engine 105. The first plurality 101a of electrical-interconnect solder bodies, of which electrical-interconnect solder bodies 101a-1 and 101a-2 are examples, includes a lateral alignment structure, such that the electrical-interconnect solder bodies, of which electrical-interconnect solder bodies 101a-1 and 101a-2 are examples, of the first plurality 101a of electrical-interconnect solder bodies are disposed at terminals of electrical traces, of which electrical traces 118-1 and 118-2 are examples, of the carrier 110 to couple to the die 210 to the carrier 110. During the fabrication process of the opto-electronic engine 105, in one example of the present technology, solder bodies from both the first plurality 101a of electrical-interconnect solder bodies disposed on the die 210 may be brought into contact with the pluralities of electrical traces disposed at the bottom side and top side of the drawing of the opto-electronic engine 105, of which electrical traces 118-1 and 118-2 are examples, respectively. Upon applying heat in a solder reflow process, the first plurality 101a of electrical-interconnect solder bodies forms solder joints with the pluralities of respective electrical traces disposed at the bottom side and top side of the drawing of the opto-electronic engine 105.

The joining of the die 210 to the carrier 110 also creates the cavity 114 in which optical paths, for example, optical pathway 210-1a, are disposed. By way of example, the cavity 114 may then be sealed with the application of the underfill material around the periphery of the die 210 to form the underfill layer 130, without limitation thereto, as the underfill material may also be applied as a preform before the solder reflow operation, as well as by other methods.

In accordance with examples of the present technology, the first plurality 101a of electrical-interconnect solder bodies, of which electrical-interconnect solder bodies 101a-1 and 101a-2 are examples, includes a lateral alignment structure, to self-align laterally electrical terminals of electrical traces, of which electrical traces 214-1 and 214-2 are examples, of the die 210 with lands on the electrical traces, of which electrical traces 118-1 and 118-2 are examples, disposed on the carrier 110. Therefore, both the electrical-interconnect solder bodies, of which electrical-interconnect solder bodies 101a-1 and 101a-2 are examples, in the first plurality 101a of electrical-interconnect solder bodies and the spacer solder bodies, of which spacer solder body 101b-1 is an example, in the second plurality 101b of spacer solder bodies may include a lateral alignment structure, to self-align laterally electrical terminals of the opto-electronic component 210-1 with lands on the electrical traces, of which electrical traces 118-1 and 118-2 are examples, disposed on the carrier 110. Moreover, the first plurality 101a of electrical-interconnect solder bodies, of which electrical-interconnect solder bodies 101a-1 and 101a-2 are examples, may include a vertical alignment structure, to self-align vertically the opto-electronic component 210-1 relative to the carrier 110 which may be interfaced to a plurality of optical fibers providing bit-lines of an optical bus 650, subsequently described in the discussion of FIG. 6A. In another example of the present technology, both the first plurality 101a electrical-interconnect solder bodies and the second plurality 101b of spacer solder bodies align the die 210 to the carrier 110 in x, y, z, pitch, and yaw axes.

Figure 5:
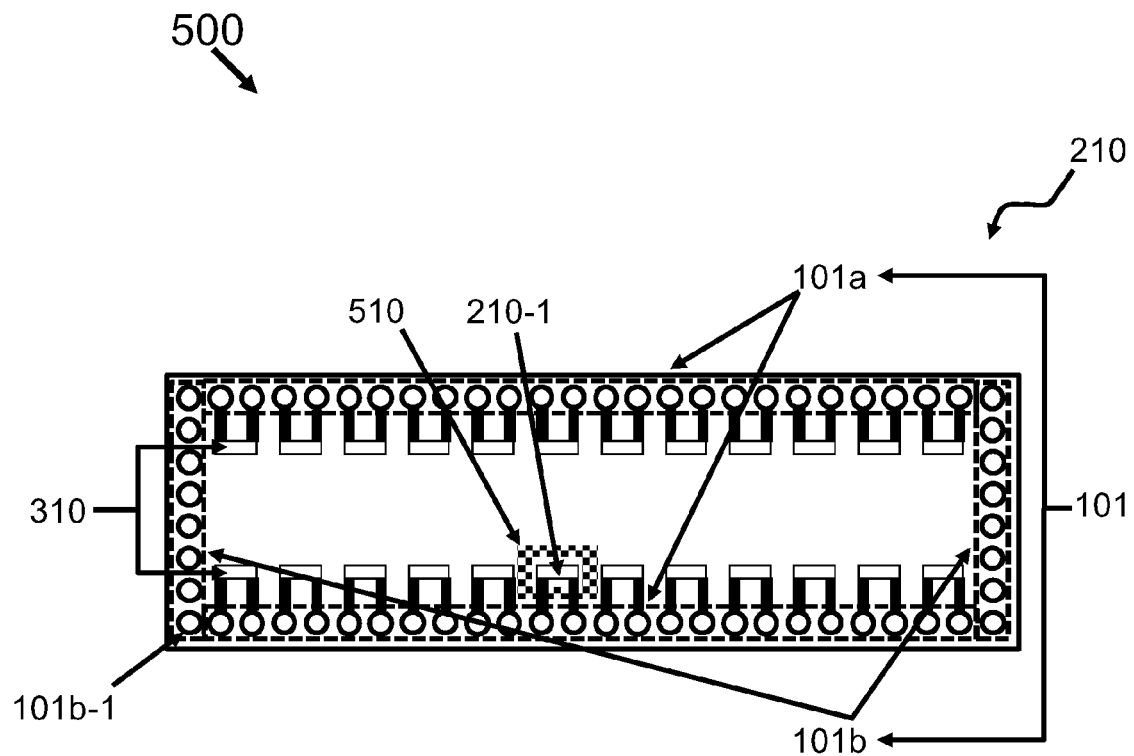
FIG. 5 is a plan view of a secondary dam and the combination underfill-dam and electrical-interconnect structure of the opto-electronic engine of FIG. 1, disposed on a die including a plurality of opto-electronic components, detailing the arrangement of a first plurality of electrical-interconnect solder bodies, a second plurality of spacer solder bodies, and the secondary dam disposed around an optical aperture of the opto-electronic component, in accordance with examples of the present technology.

With reference now to FIG. 5 and FIGS. 1-4, in accordance with examples of the present technology, a plan view 500 is shown of a secondary dam 510 and the combination underfill-dam and electrical-interconnect structure 101 of the opto-electronic engine 105 of FIG. 1. The combination underfill-dam and electrical-interconnect structure 101 is disposed on the die 210 including a plurality of opto-electronic components, of which opto-electronic component 210-1 is an example. FIG. 5 shows details of the arrangement of the first plurality 101a of electrical-interconnect solder bodies, the second plurality 101b of spacer solder bodies, and the secondary dam 510 disposed around an optical aperture of the opto-electronic component 210-1. Thus, in accordance with examples of the present technology, the opto-electronic engine 105 further includes the secondary dam 510 disposed around the optical aperture of the opto-electronic component 210-1. As shown in FIG. 5, for one example of the present technology, the secondary dam 510 is disposed on the die 210; but, in another example of the present technology, the secondary dam 510 may also be disposed on the carrier 110. As shown in FIG. 5, although the single opto-electronic component 210-1 has a single secondary dam 510, in another example of the present technology, each opto-electronic component in the plurality 310 of opto-electronic components, of which opto-electronic component 210-1 is an example, may be provided with its own secondary dam, of which secondary dam 510 is an example. Similar to the combination underfill-dam and electrical-interconnect structure 101, the secondary dams may be disposed on the die 210 including the opto-electronic component 210-1 as shown in FIG. 5, or alternatively, on the carrier 110. Moreover, in one example of the present technology, the secondary dams, unlike the combination underfill-dam and electrical-interconnect structure 101, may not form solder joints between the die 210 and the carrier 110.

Figure 6A:
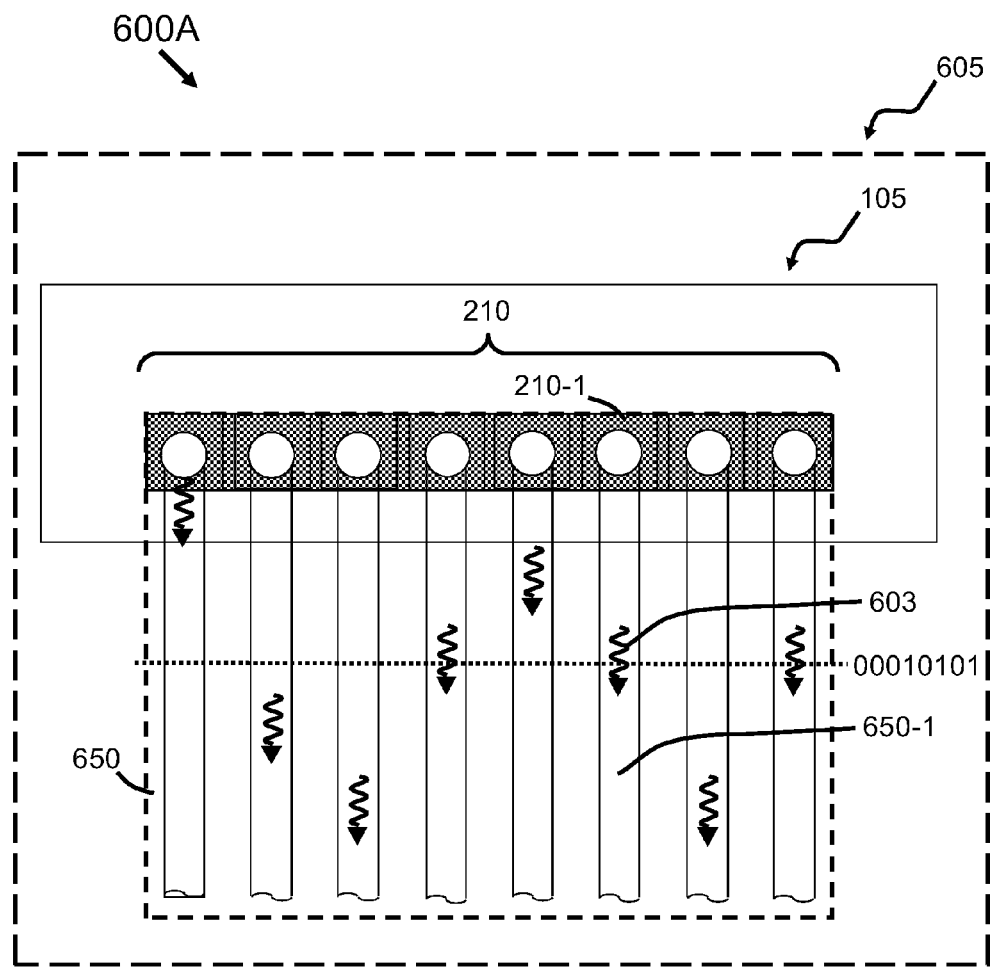
FIG. 6A is a schematic diagram of an opto-electronic engine, and an example system including at least one optical bus and at least one opto-electronic engine, in accordance with examples of the present technology.

With reference now to FIG. 6A and further reference to FIGS. 1-5, in accordance with examples of the present technology, a schematic diagram 600A is shown of an opto-electronic engine 105 including the die 210, which may include a plurality of opto-electronic components, of which opto-electronic component 210-1 is an example. The plurality of the opto-electronic components may be arranged in the die 210. By way of example, as shown in FIG. 6A, in accordance with one example of the present technology, the array of opto-electronic components may be one by eight, without limitation thereto. Alternatively, by way of another example (not shown in FIG. 6A, but see FIG. 4) of the present technology, the array of opto-electronic components may be two by twelve, without limitation thereto. Alternatively, in accordance with examples of the present technology, the array of opto-electronic components may be more generally n by m, where n is the number of rows in the array, and m is the number of columns in the array.

Previously described examples of the present technology for the combination underfill-dam and electrical-interconnect structure 101 of FIGS. 1-5 may be incorporated within the environment of an opto-electronic engine 105. By way of example, as shown in FIG. 6A, the opto-electronic engine 105 may be configured as an optical bus transmitter, as for the case in which the plurality of opto-electronic components is a plurality of VCSELs, without limitation thereto. In accordance with examples of the present technology, as shown in FIG. 6A, an opto-electronic component 210-1 of the opto-electronic engine 105 may be configured as an optical output transmitter for an optical fiber that serves as a bit-line, for example, bit-line 650-1, of an optical bus 650. Each bit-line in optical bus 650 is to receive light emitted from an opto-electronic component of the opto-electronic engine 105. For example, bit-line 650-1 is to receive light 603 emitted from opto-electronic component 210-1 of the plurality of opto-electronic components in the die 210 included in the opto-electronic engine 105. As shown in FIG. 6A, the bit-lines in optical bus 650 may be to transmit a byte of information associated in positive logic with a bit corresponding to a pulse of light emitted from selected opto-electronic component in the die 210. Alternatively, by way of another example (not shown), the opto-electronic engine 105 may be configured as an optical bus receiver, as for the case in which the plurality of opto-electronic components is a plurality of PDs, without limitation thereto.

However, for the optical transmitter example of FIG. 6A, with further reference to FIGS. 1-4, a pulse of light 603 emitted from opto-electronic component 210-1 corresponds to a sixth bit, a logical "1," of an eight-bit byte, given by bit-string "00010101," which corresponds to pulses of light emitted from selected opto-electronic components of the die 210 (as is indicated by the dotted line in FIG. 6A). As shown in FIG. 6A, by way of example, opto-electronic component 210-1 is the sixth opto-electronic component in the 1×8 array. Similarly opto-electronic component 210-1 is the sixth opto-electronic component in the second row of the 2×12 array shown in FIGS. 3-5, without limitation thereto. Although examples of the present technology may be described herein using opto-electronic component 210-1, examples of the present technology apply, more generally, to opto-electronic components of an n×m array in a die of an opto-electronic engine. Also, by way of example, FIG. 6A shows the optical bus 650 configured for the transmission of eight-bit bytes, without limitation thereto. However, optical buses including more or less optical fibers than shown in FIG. 6A are also within the spirit and scope of examples of the present technology, for example, in the case of an optical bus including twelve optical fibers. Moreover, by way of example, the optical bus 650 in FIG. 6A has been so far described as transmitting bytes in a parallel-bus configuration. However, in another example of the present technology, the optical bus 650 may also transmit bytes serially on each individual bit-line.

In FIG. 6A, in accordance with examples of the present technology, the schematic diagram 600A also shows an example system 605 including at least one optical bus 650 and at least one opto-electronic engine 105. However, examples of the present technology also include within their spirit and scope systems with other components integrated with the optical buses and opto-electronic engines, similar to optical bus 650 and opto-electronic engine 105, which are next described.

Figure 6B:
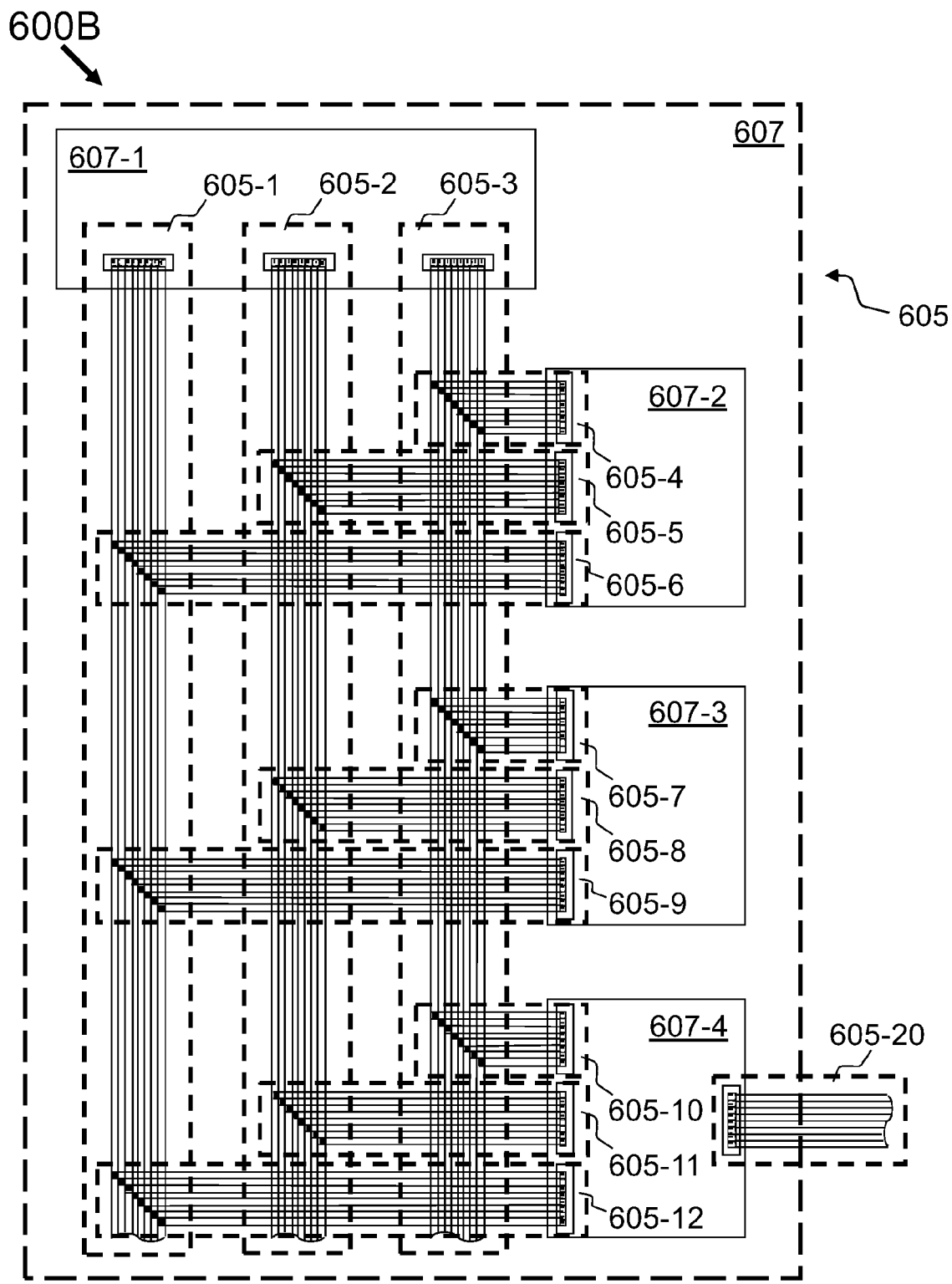
FIG. 6B is a schematic diagram of another example system, a digital-information processor, including at least one optical bus and at least one opto-electronic engine of FIG. 6A, in accordance with examples of the present technology.

With reference now to FIG. 6B and further reference to FIG. 6A, in accordance with examples of the present technology, a schematic diagram 600B is shown of yet another example system 605, which includes a digital-information processor 607, including at least one optical bus and at least one opto-electronic engine, for example, optical bus 650 and opto-electronic engine 105. In accordance with examples of the present technology, the system 605 may further include an integrated combination of components, for example, a digital-information processor 607. In accordance with examples of the present technology, the digital-information processor 607 includes a plurality of components 607-1, 607-2, 607-3 and 607-4 integrated with at least one optical bus and at least one opto-electronic engine, for example, opto-electronic engine 105. In accordance with examples of the present technology, at least one optical bus and at least one opto-electronic engine are to transfer information between one component and another component coupled to the optical bus in the digital-information processor 607. As used herein, a digital-information processor 607 includes an electronic apparatus that processes at least some information in digital form, for example, a computer, a server, a switch, a router, or a digital-electronic apparatus, without limitation thereto, such that the digital information is conveyed by at least one optical bus and at least one opto-electronic engine. For example, digital-information processor 607 may include a server including components 607-1, 607-2, 607-3 and 607-4 such that components 607-1, 607-2, 607-3 and 607-4 are: a central processing unit (CPU), a program memory, a data memory, and an input/output module, respectively.

With further reference to FIGS. 6A and 6B, in accordance with examples of the present technology, digital-information processor 607 is integrated with plurality of components 607-1, 607-2, 607-3 and 607-4 with a plurality of combined optical bus/opto-electronic engines 605-1, 605-2, 605-3, 605-4, 605-5, 605-6, 605-7, 605-8, 605-9, 605-10, 605-11 and 605-12, similar to the optical bus 650 and opto-electronic engine 105 of FIG. 6A. As shown in FIG. 6B, the respective combined optical bus/opto-electronic engines 605-1, 605-2 and 605-3 are coupled with components 607-2, 607-3 and 607-4 by respective combined optical bus/opto-electronic engines. For example, combined optical bus/opto-electronic engine 605-1 is coupled with components 607-2, 607-3 and 607-4 by respective combined optical bus/opto-electronic engines 605-6, 605-9 and 605-12. Similarly, combined optical bus/opto-electronic engine 605-2 is coupled with components 607-2, 607-3 and 607-4 by respective combined optical bus/opto-electronic engines 605-5, 605-8 and 605-11. Similarly, combined optical bus/opto-electronic engine 605-3 is coupled with components 607-2, 607-3 and 607-4 by respective combined optical bus/opto-electronic engines 605-4, 605-7 and 605-10. As shown in FIG. 6B, by way of example, the combined optical bus/opto-electronic engines may be configured as bi-directional devices such that an opto-electronic engine is disposed at either end of an optical bus, without limitation thereto.

Moreover, with further reference to FIGS. 6A and 6B, optical-bus receivers (not shown) may be interfaced to one or another end of an optical bus such that bi-directional and uni-directional optical buses are within the spirit and scope of examples of the present technology. By way of further example, in one example of the present technology, for the system 605 including a server as digital-information processor 607, the CPU, component 607-1, may be integrated with the program memory, the data memory, and the input/output module, respectively, components 607-2, 607-3 and 607-4, with a data bus, a control bus and an address bus. For one example of the present technology in which the system 605 includes the server, the data bus is included in respective combined optical bus/opto-electronic engines 605-1, 605-6, 605-9 and 605-12. Also, the control bus is included in respective combined optical bus/opto-electronic engines 605-2, 605-5, 605-8 and 605-11. Similarly, the address bus is included in respective combined optical bus/opto-electronic engines 605-3, 605-4, 605-7 and 605-10. As shown in FIG. 6B, in another example of the present technology, the digital-information processor 607 may include an input/output module, component 607-4, that is coupled with a combined optical bus/opto-electronic engine 605-20 that provides for the input and output of digital information to and from the digital-information processor 607, for example, a server, a router, or a switch, which is next described.

Figure 6C:
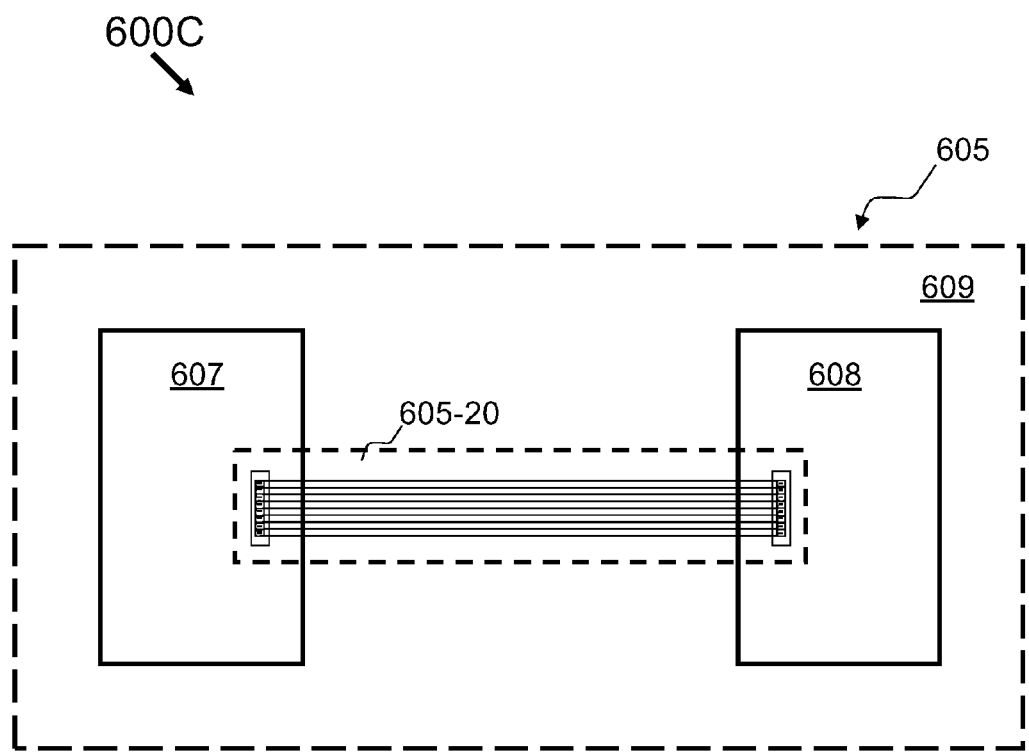
FIG. 6C is a schematic diagram of yet another example system, a data-processing center, including at least one optical bus and at least one opto-electronic engine of FIG. 6A, in accordance with examples of the present technology.

With reference now to FIG. 6C and further reference to FIGS. 6A and 6B, in accordance with examples of the present technology, a schematic diagram 600C is shown of yet another example system 605, a data-processing center 609 including at least one optical bus and at least one opto-electronic engine, for example, optical bus 650 and opto-electronic engine 105 of FIG. 6A. In accordance with examples of the present technology, the system 605 may further include an integrated combination of components, for example, a data-processing center 609. In accordance with examples of the present technology, the data-processing center 609 includes a plurality of digital-information processors, for example, digital-information processors 607 and 608, integrated with at least one optical bus and at least one opto-electronic engine, for example, combined optical bus/opto-electronic engine 605-20. In accordance with examples of the present technology, at least one optical bus and at least one opto-electronic engine are to transfer information between one digital-information processor 607 and another digital-information processor 608 coupled to the optical bus in the data-processing center 607. By way of example, in one example of the present technology, data-processing center 609 may include one server, router, or switch, including digital-information processor 607, and another server, router, or switch, including digital-information processor 608, without limitation thereto. However, examples of the present technology also include within their spirit and scope systems that include a plurality of servers, routers, switches, or combinations of servers, routers and switches integrated with combined optical bus/opto-electronic engines, of which combined optical bus/opto-electronic engine 605-20 is an example.

The foregoing descriptions of specific examples of the present technology have been presented for purposes of illustration and description. They are not intended to be exhaustive or to limit the technology to the precise forms disclosed, and many modifications and variations are possible in light of the above teaching. The examples described herein were chosen and described in order to best explain the principles of the technology and its practical application, to thereby enable others skilled in the art to best utilize the technology and various examples with various modifications as are suited to the particular use contemplated. It may be intended that the scope of the technology be defined by the claims appended hereto and their equivalents.

What is claimed is:

1. A combination underfill-dam and electrical-interconnect structure for an opto-electronic engine, said structure comprising:
    a first plurality of electrical-interconnect solder bodies; and
    a carrier on which said opto-electronic engine is supported, wherein said carrier is etched to form a surface feature to which said solder bodies are attached;
    wherein said first plurality of electrical-interconnect solder bodies comprises a plurality of electrical interconnects;
    wherein said first plurality of electrical-interconnect solder bodies is disposed to inhibit intrusion of underfill material into an optical pathway of an opto-electronic component for said opto-electronic engine; and
    wherein said surface feature also inhibiting intrusion of underfill material into said optical pathway with said solder bodies.

2. The combination underfill-dam and electrical-interconnect structure of claim 1, further comprising:
    a second plurality of spacer solder bodies; and
    wherein said first plurality of electrical-interconnect solder bodies and said second plurality of spacer solder bodies enclose an optical pathway of an opto-electronic component for said opto-electronic engine, and in combination comprise an underfill dam to bar intrusion of underfill material into said optical pathway.

3. The combination underfill-dam and electrical-interconnect structure of claim 2, wherein said spacer solder bodies and said electrical-interconnect solder bodies are arranged to mechanically support a die.

4. The combination underfill-dam and electrical-interconnect structure of claim 2, wherein an interior surface surrounded by said first plurality of electrical-interconnect solder bodies and said second plurality of spacer solder bodies has a surface treatment that prevents wetting of said interior surface by said underfill material.

5. The combination underfill-dam and electrical-interconnect structure of claim 4, wherein said surface treatment comprises one selected from the group consisting of a thin coating that repels said underfill material, a texturing of said interior surface that raises a surface energy between said interior surface and said underfill material.

6. The combination underfill-dam and electrical-interconnect structure of claim 1, wherein an electrical-interconnect solder body of said first plurality of electrical-interconnect solder bodies comprises a solder ball.

7. The combination underfill-dam and electrical-interconnect structure of claim 1, wherein said first plurality of electrical-interconnect solder bodies comprises a vertical alignment structure, to self-align vertically said opto-electronic component relative to a carrier.

8. The combination underfill-dam and electrical-interconnect structure of claim 1, wherein said first plurality of electrical-interconnect solder bodies comprises a lateral alignment structure, to self-align laterally electrical terminals of a die with lands on electrical traces disposed on a carrier.

9. An opto-electronic engine, comprising:
    a die including an opto-electronic component;
    an underfill layer;
    a combination underfill-dam and electrical-interconnect structure, comprising:
        a first plurality of electrical-interconnect solder bodies; and
        a second plurality of spacer solder bodies;
        wherein said first plurality of electrical-interconnect solder bodies and said second plurality of spacer solder bodies comprise:
            solder joints joining said die and said carrier; and
            an underfill dam to bar intrusion into an optical pathway of underfill material from said underfill layer;
        wherein said first plurality of electrical-interconnect solder bodies comprises a plurality of electrical interconnects; and
    a carrier which said opto-electronic engine is supported, wherein said carrier is etched to form a surface feature to which said electrical-interconnect solder bodies are attached;
    wherein said underfill layer is disposed outside of an optical pathway of said opto-electronic component, said optical pathway disposed within a cavity defined between said die and said carrier; and wherein said surface feature to bar intrusion of underfill material into said optical pathway with said electrical-interconnect solder bodies.

10. The opto-electronic engine of claim 9, wherein said cavity is free of underfill material from said underfill layer.

11. The opto-electronic engine of claim 9, wherein said opto-electronic component is selected from the group consisting of a vertical-cavity, surface-emitting laser (VCSEL), an edge emitting laser, a light emitting diode, and a photodiode.

12. The opto-electronic engine of claim 9, further comprising:
a third plurality of mechanical-support solder bodies to provide mechanical supports between said die and said carrier.

13. The opto-electronic engine, of claim 9, further comprising:
a secondary dam disposed around an optical aperture of said opto-electronic component.

14. A system, comprising:
an optical bus; and
an opto-electronic engine, comprising:
a die including an opto-electronic component;
an underfill layer;
a combination underfill-dam and electrical-interconnect structure, comprising:
a first plurality of electrical-interconnect solder bodies; and
a second plurality of spacer solder bodies;
wherein said first plurality of electrical-interconnect solder bodies and said second plurality of spacer solder bodies comprise:
solder joints joining said die and said carrier; and
an underfill dam to bar intrusion into an optical pathway of underfill material from said underfill layer;
wherein said first plurality of electrical-interconnect solder bodies comprises a plurality of electrical interconnects; and
a carrier which said opto-electronic engine is supported, wherein said carrier is etched to form a surface feature to which said electrical-interconnect solder bodies are attached;
wherein said underfill dam composed of said solder joints forms a boundary between said underfill layer and said optical pathway, where said underfill layer is disposed outside of said optical pathway of said opto-electronic component, said optical pathway disposed within a cavity defined between said die and said carrier;
wherein said opto-electronic engine is interfaced to a plurality of bit-lines of said optical bus, and said opto-electronic component is selected from the group consisting of an optical transmitter, an optical receiver, and an optical transceiver; and
wherein said surface feature to bar intrusion of underfill material into said optical pathway with said electrical-interconnect solder bodies.

15. The system of claim 14, further comprising:
an integrated combination of components selected from the group consisting of a digital-information processor comprising a plurality of components integrated with said optical bus and said opto-electronic engine wherein said optical bus and said opto-electronic engine are to transfer information between one component and another component coupled to said optical bus in said digital-information processor, and a data-processing center comprising a plurality of digital-information processors and wherein said optical bus and said opto-electronic engine are to transfer information between one digital-information processor and another digital-information processor coupled to said optical bus in the data-processing center.

16. The combination underfill-dam and electrical-interconnect structure of claim 1, wherein said first plurality of solder bodies form a boundary between said underfill material and said optical pathway of said opto-electronic component.

17. The combination underfill-dam and electrical-interconnect structure of claim 1, wherein said optical pathway of said opto-electronic component comprises a transparent substrate on which said opto-electronic engine is supported.

18. The combination underfill-dam and electrical-interconnect structure of claim 1, wherein a shape and material of the solder bodies are matched to a viscosity and other rheological properties of said underfill material to increase preclusion of said underfill material from entering said optical pathway.

19. The combination underfill-dam and electrical-interconnect structure of claim 1, further comprising a solder-body surface treatment on a surface of said solder bodies which causes said underfill material to wet said solder bodies and inhibits said underfill material from flowing past said solder bodies to said optical pathway.

* * * * *